US007872602B2

(12) United States Patent
Chen

(10) Patent No.: US 7,872,602 B2
(45) Date of Patent: Jan. 18, 2011

(54) TIME TO DIGITAL CONVERTING CIRCUIT AND RELATED METHOD

(75) Inventor: Yi-Lin Chen, Taipei (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 58 days.

(21) Appl. No.: 12/357,403

(22) Filed: Jan. 22, 2009

(65) Prior Publication Data

US 2009/0195429 A1 Aug. 6, 2009

(30) Foreign Application Priority Data

Feb. 1, 2008 (TW) .............................. 97103848 A

(51) Int. Cl.
*H03M 1/00* (2006.01)

(52) U.S. Cl. ....................................... 341/166; 327/290

(58) Field of Classification Search ................. 341/160, 341/166; 327/270, 392–403
See application file for complete search history.

(56) References Cited

U.S. PATENT DOCUMENTS 6,097,674 A * 8/2000 Swapp ........................ 368/113
6,754,613 B2 * 6/2004 Tabatabaei et al. .......... 702/189
2006/0284650 A1 * 12/2006 Kato ........................... 326/99
2010/0182186 A1 * 7/2010 Lin et al. .................... 341/166

* cited by examiner

*Primary Examiner*—Howard Williams
(74) *Attorney, Agent, or Firm*—Winston Hsu; Scott Margo

(57) ABSTRACT

A TDC circuit includes: a first delay circuit, including at least one first delay stage for delaying a first input signal to generate a first output signal; a second delay circuit, including at least one second delay stage for delaying a second input signal to generate a second output signal; a first counter, for computing the first output signal to generate a first counter value; a second counter, for computing the second output signal to generate a second counter value; and a comparator, for comparing the first counter value and the second counter value to generate a comparing result signal; wherein the first delay stage has a larger delay amount than the second delay stage, the first counter starts before the second counter, and the comparator outputs the comparing result signal when the second counter value falls within a predetermined range of the first counter value.

10 Claims, 2 Drawing Sheets

TIME TO DIGITAL CONVERTING CIRCUIT AND RELATED METHOD

BACKGROUND OF THE INVENTION

1. Field of the Invention

The present invention relates to time to digital converting (TDC) circuits, and more particularly, to a time to digital converting (TDC) circuit utilizing delay circuits to generate periodic delay signals and a related method.

2. Description of the Prior Art

In general, a time to digital converting (TDC) circuit is utilized for measuring the delay level of a signal under test and transferring the abstract delay level into a physical delay amount provided by delay stage(s). That is, the time to digital converting circuit is capable of expressing the delay level of a signal under test by the number of delay stages. Taking a conventional time to digital converting circuit as an example, a first signal and a second signal are sent to a first delay circuit and a second delay circuit respectively. As a result, after a certain amount of time, the second signal will catch up with the first signal. When the two signals (i.e., the first signal and the second signal) are synchronized, the delay level of the first signal is derived by computing a total difference between the number of delay stages that the first signal has passed and the number of delay stages that the second signal has passed.

Ordinarily, a specified scheme different from the aforementioned one obtains a difference (i.e., ts−tf) between a certain delay stage (ts) having a larger delay amount and another delay stage (tf) having a smaller delay amount, and then represents a delay situation of the signal under test as N(ts−tf). Since the structure and operation of such a TDC circuit and the computing method thereof are well known to people skilled in this art, further description is omitted here for brevity.

The conventional TDC circuit and method thereof require the use of a complete delay circuit, however, resulting in a larger circuit area.

SUMMARY OF THE INVENTION

It is therefore one of the objectives of the present invention to provide a time to digital converting (TDC) circuit and a method thereof, to solve the above problems.

According to one aspect of the present invention, a time to digital converting (TDC) circuit is disclosed. The time to digital converting circuit includes a first delay circuit, a second delay circuit, a first counter, a second counter, and a comparator. The first delay circuit, including at least one first delay stage, is implemented for generating a first output signal by delaying a first input signal. The second delay circuit, including at least one second delay stage, is implemented for generating a second output signal by delaying a second input signal. The first counter, coupled to the first delay circuit, is implemented for generating a first counter value by computing the first output signal. The second counter, coupled to the second delay circuit, is implemented for generating a second counter value by computing the second output signal. The comparator, coupled to the first counter and the second counter, is implemented for generating a comparing result signal by comparing the first counter value with the second counter value; wherein the first delay stage has a larger delay amount than the second delay stage, the first counter starts counting earlier than the second counter, and the comparator outputs the comparing result signal when the second counter value falls within a predetermined range of values including the first counter value.

According to another aspect of the present invention, a time to digital converting method is disclosed. The time to digital converting method includes: utilizing at least one first delay stage for delaying a first input signal to therefore generate a first output signal; utilizing at least one second delay stage for delaying a second input signal to therefore generate a second output signal; generating a first counter value by computing the first output signal; generating a second counter value by computing the second output signal; and generating a comparing result signal by comparing the first counter value with the second counter value. The first delay stage has a larger delay amount than the second delay stage, and the first counter starts counting earlier than the second counter. The comparator outputs the comparing result signal when the second counter value falls within a predetermined range of values including the first counter value.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
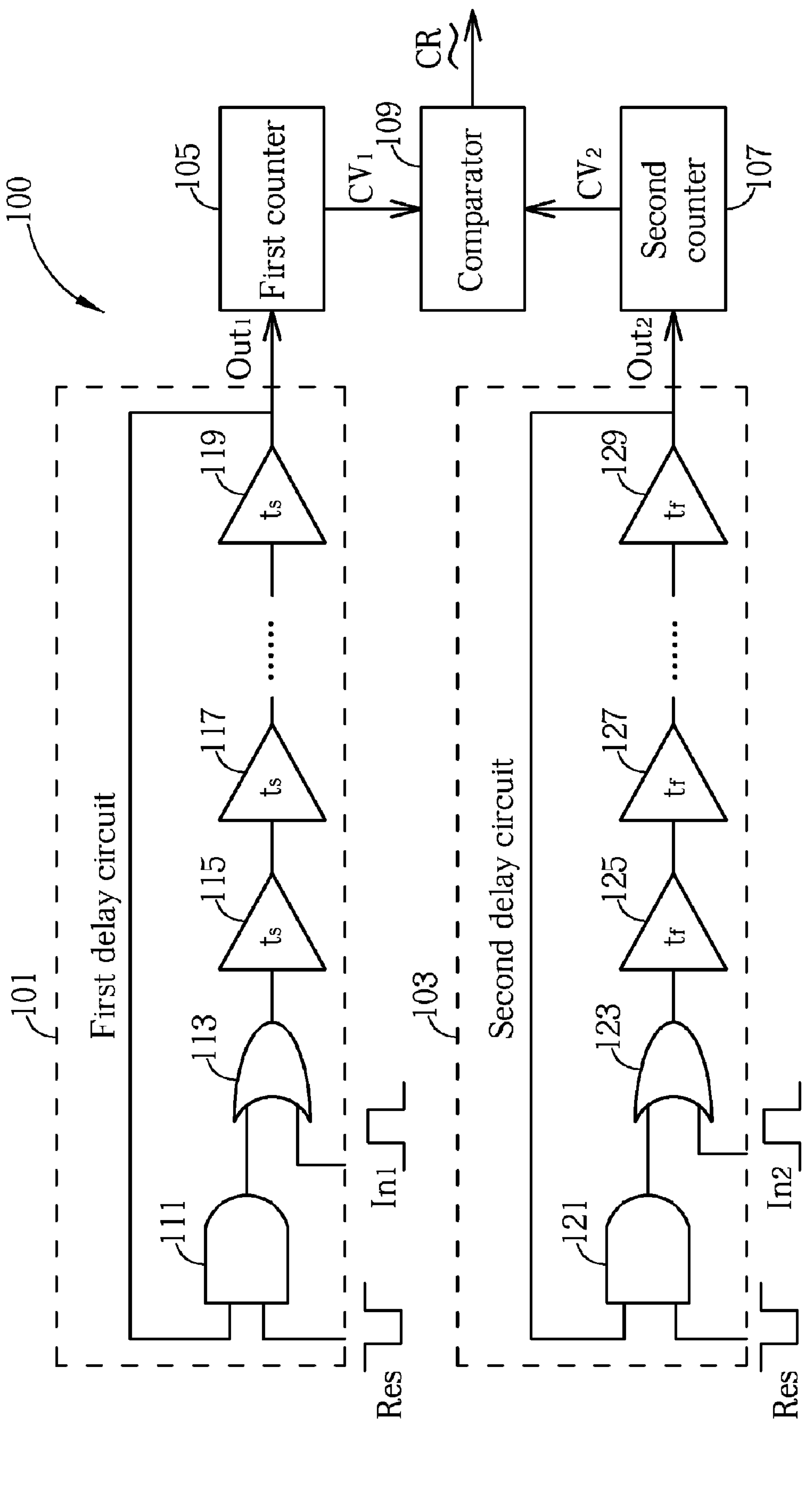
FIG. 1 is a block diagram illustrating a TDC circuit according to a first embodiment of the present invention.

Please refer to FIG. 1. FIG. 1 is a block diagram illustrating a TDC circuit 100 according to a first embodiment of the present invention. As shown in FIG. 1, the TDC circuit 100 includes a first delay circuit 101 (which is a periodic delay circuit), a second delay circuit 103 (which is a periodic delay circuit), a first counter 105, a second counter 107, and a comparator 109. The first delay circuit 101 includes at least one first delay stage (first delay stages 115, 117, 119 in this exemplary embodiment) for delaying a first input signal $In_1$ to generate a first output signal $Out_1$ accordingly. Similarly, the second delay circuit 103 includes at least one second delay stage (second delay stages 125, 127, 129 in this exemplary embodiment) for delaying a second input signal $In_2$ to generate a second output signal Outs accordingly, where the second input signal $In_2$ is a predetermined reference signal in this exemplary embodiment.

As shown in FIG. 1, the first counter 105 coupled to the first delay circuit 101 is implemented for generating a first counter value $CV_1$ by counting the first output signal $Out_1$; the second counter 107 coupled to the second delay circuit 103 is implemented for generating a second counter value $CV_2$ by counting the second output signal $Out_2$. The comparator 109 is coupled to the first counter 105 and the second counter 107, and is used to compare the first counter value $CV_1$ and the second counter value $CV_2$ to generate a comparing result signal CR accordingly.

In this embodiment, the first delay stages 115, 117 and 119 have larger respective delay amounts than those of the second delay stages 125, 127 and 129. In addition, the first counter 105 starts counting earlier than the second counter 107, i.e. the first input signal $In_1$ is input earlier than the second input signal $In_2$. In this embodiment, when the first counter value $CV_1$ is equal to the second counter value $CV_2$, it means the first input signal $In_1$ is caught up by the second input signal $In_2$ and the comparator 109 hence outputs the comparing result signal CR. In one implementation, the comparator 109 can be further coupled to a specific circuit (not shown) and the comparing result signal CR can serve as a trigger signal of the specific circuit. In another embodiment of the present invention, when the first counter value $CV_1$ approaches the second counter value $CV_2$ with a small difference therebetween, the TDC 100 can omit the small difference and deem that the second input signal $In_2$ has caught up the first input signal $In_1$. Such an alternative design also falls within the scope of the present invention. In other words, when the second counter value $CV_2$ falls within a predetermined range of values including the first counter value $CV_1$, the comparator 109 will regard the two input signals as synchronized with each other and hence output the comparing result signal CR.

Furthermore, in this embodiment shown in FIG. 1, the first delay circuit 101 (which is a periodic delay circuit) further includes an AND gate 111 and an OR gate 113. The AND gate 111 receives a reset signal RES and resets the first output signal $OUT_1$, and the OR gate 113 is coupled to the AND gate 111 for outputting a signal to the following first delay stages 115, 117 and 119 according to the output from the AND gate 111 and the first input signal $In_1$. Similarly, the second delay circuit 103 (which is a periodic delay circuit) includes an AND gate 121, an OR gate 123, and a plurality of second delay stages 125, 127 and 129; since the second delay circuit 103 has a circuit structure identical to that of the first delay circuit 101 except for the delay amount of the delay stages, the detailed description is omitted here for brevity. In addition, since the operation of the delay circuits 101 and 103 are readily known to people skilled in this art, further descriptions are omitted here as well.

The circuit structure of the first delay circuit 101 and second delay circuit 103 in FIG. 1 are for illustrative purposes only and are not meant to be taken as limitations of the present invention. Other delay circuits with different circuit structures obeying the spirit of the present invention are possible and also fall within the scope of the present invention.

From the above description, the TDC circuit 100 determines whether the first input signal $In_1$ catches up with the second input signal $In_2$ according to the first counter value $CV_1$ and the second counter value $CV_2$, where each of the first counter value $CV_1$ and second counter value $CV_2$ respectively have more than one delay stage. In this way, the required circuit areas of the delay circuits 101 and 103 are greatly reduced. For instance, provided that the difference between the first input signal $In_1$ and the second input signal $In_2$ can be expressed as N(ts−tf), the conventional delay circuit would require at least N delay stages to compute the difference. However, if there are K delay stages within each periodic delay circuit implemented in the TDC circuit of the present invention, each counter value can be used to represent K(ts−tf). As a result, compared to the conventional delay circuit, the delay circuit of the present invention can compute the same difference using 1/K circuit area.

Figure 2:
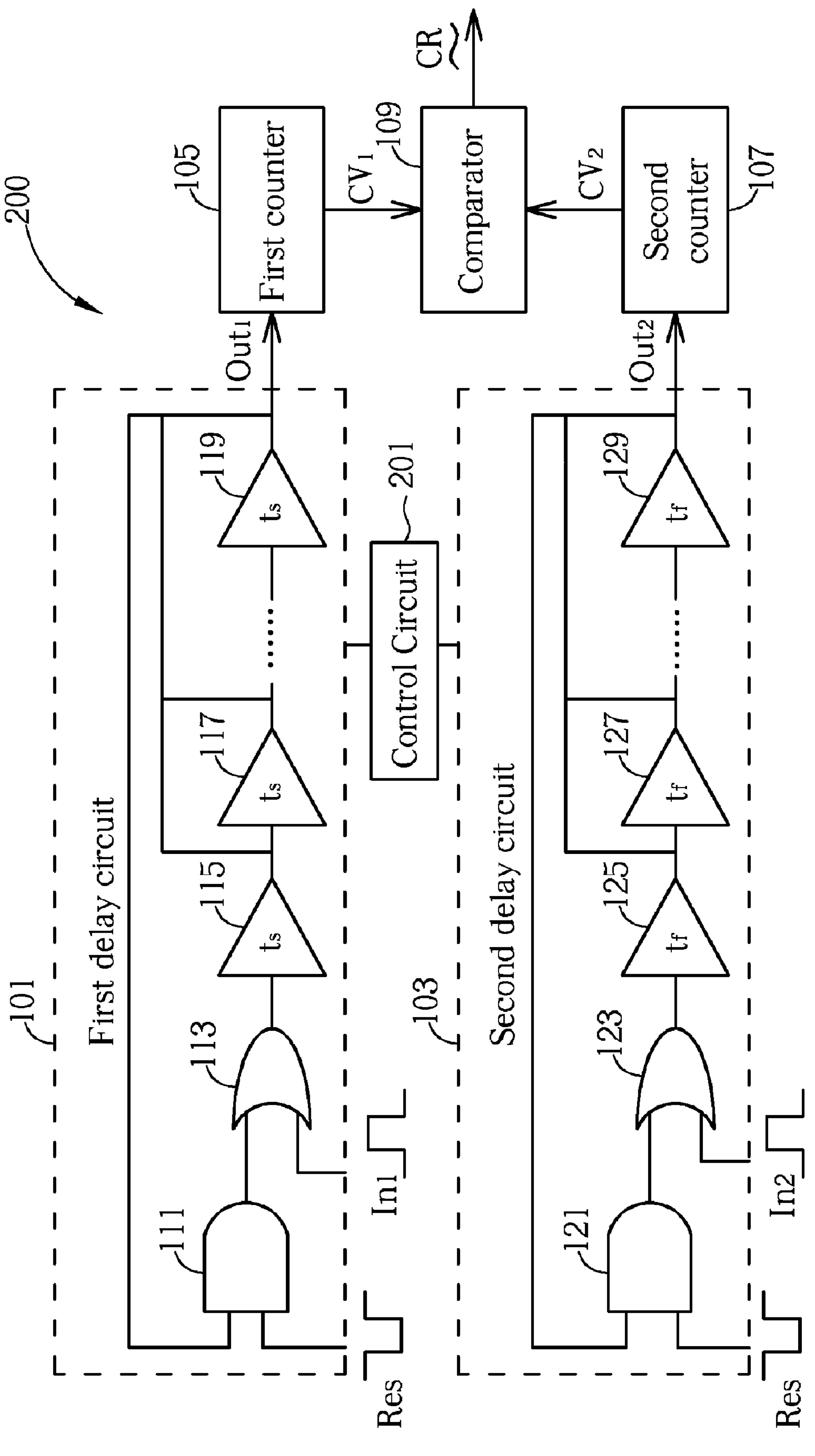
FIG. 2 is a block diagram illustrating a TDC circuit according to a second embodiment of the present invention.

Please refer to FIG. 2; FIG. 2 is a block diagram illustrating a TDC circuit 200 according to a second embodiment of the present invention. The circuit structure of the TDC circuit 200 shown in FIG. 2 is similar to that of the TDC circuit 100 shown in FIG. 1. The difference is that the TDC circuit 200 shown in FIG. 2 further includes a control circuit 201 to control how many delay stages are used in the first and second delay circuits 101, 103 to generate the required output signal. That is, the control circuit 201 is used to make the output signals $Out_1$ and $Out_2$ correspond to a portion of the delay stages in the first delay circuit and second delay circuit, respectively. In this way, the application field of the disclosed TDC circuit in the present invention is broadened. In addition, the use of the control circuit 201 is not necessary for selecting the required number of the first/second delay stages to selectively output the output signals of different delay situations. Other schemes for selectively choosing the required number of delay stages in the first delay circuit 101 and second delay circuit 103 to generate the first output signal $Out_1$ and the second output signal $Out_2$ also fall within the scope of the present invention.

According to the above disclosure directed to the exemplary TDC circuits, the present invention further discloses a TDC method accordingly. The TDC method includes: utilizing at least one first delay stage for delaying a first input signal to therefore generate a first output signal; utilizing at least one second delay stage for delaying a second input signal to therefore generate a second output signal; generating a first counter value by computing the first output signal; generating a second counter value by computing the second output signal; and generating a comparing result signal by comparing the first counter value with the second counter value. The first delay stage has a larger delay amount than the second delay stage, and the first counter starts counting earlier than the second counter. The comparator outputs the comparing result signal when the second counter value falls within a predetermined range of values including the first counter value. Since the spirit of the TDC method has been disclosed above, further description is omitted here for brevity.

Those skilled in the art will readily observe that numerous modifications and alterations of the device and method may be made while retaining the teachings of the invention.

What is claimed is:

1. A time to digital converting (TDC) circuit, comprising:

a first delay circuit, comprising at least a first delay stage, for generating a first output signal by delaying a first input signal;

a second delay circuit, comprising at least a second delay stage, for generating a second output signal by delaying a second input signal;

a first counter, coupled to the first delay circuit, for generating a first counter value by counting the first output signal;

a second counter, coupled to the second delay circuit, for generating a second counter value by counting the second output signal; and a comparator, coupled to the first counter and the second counter, for generating a comparing result signal by comparing the first counter value with the second counter value;

wherein the first delay stage has a larger delay amount than the second delay stage, the first counter starts counting earlier than the second counter, and the comparator outputs the comparing result signal when the second counter value falls within a predetermined range of values including the first counter value; wherein the first delay circuit comprises a plurality of first delay stages, and the first output signal corresponds to a portion of the first delay stages.

2. The TDC circuit of claim 1, wherein the comparator outputs the comparing result signal when the second counter value is substantially equal to the first counter value.

3. The TDC circuit of claim 1, wherein the comparator is coupled to a specific circuit, and the comparing result signal serves as a trigger signal to the specific circuit.

4. The TDC circuit of claim 1, wherein the second delay circuit comprises a plurality of second delay stages, and the second output signal corresponds to a portion of the second delay stages.

5. A time to digital converting (TDC) method, comprising:

utilizing at least a first delay stage for delaying a first input signal to generate a first output signal;

utilizing at least a second delay stage for delaying a second input signal to generate a second output signal;

generating a first counter value by counting the first output signal;

generating a second counter value by counting the second output signal; and generating a comparing result signal by comparing the first counter value with the second counter value;

wherein the first delay stage has a larger delay amount than the second delay stage, the first counter starts counting earlier than the second counter, and the comparator outputs the comparing result signal when the second counter value falls within a predetermined range of values including the first counter value; wherein the step of utilizing at least a first delay stage for delaying a first input signal to generate a first output signal comprises utilizing a plurality of first delay stages, where the first output signal corresponds to a portion of the first delay stages.

6. The TDC method of claim 5, wherein the step of generating a comparing result signal by comparing the first counter value with the second counter value comprises outputting the comparing result signal when the second counter value is substantially equal to the first counter value.

7. The TDC method of claim 5, wherein the comparing result signal serves as a trigger signal of a specific circuit.

8. The TDC method of claim 5, wherein the step of utilizing at least a second delay stage for delaying a second input signal to therefore generate a second output signal comprises utilizing a plurality of second delay stages, where the second output signal corresponds to a portion of the second delay stages.

9. A time to digital converting (TDC) circuit, comprising:

a first delay circuit, comprising at least a first delay stage, for generating a first output signal by delaying a first input signal;

a second delay circuit, comprising at least a second delay stage, for generating a second output signal by delaying a second input signal;

a first counter, coupled to the first delay circuit, for generating a first counter value by counting the first output signal;

a second counter, coupled to the second delay circuit, for generating a second counter value by counting the second output signal; and a comparator, coupled to the first counter and the second counter, for generating a comparing result signal by comparing the first counter value with the second counter value;

wherein the first delay stage has a larger delay amount than the second delay stage, the first counter starts counting earlier than the second counter, and the comparator outputs the comparing result signal when the second counter value falls within a predetermined range of values including the first counter value; wherein the second delay circuit comprises a plurality of second delay stages, and the second output signal corresponds to a portion of the second delay stages.

10. A time to digital converting (TDC) method, comprising:

utilizing at least a first delay stage for delaying a first input signal to generate a first output signal;

utilizing at least a second delay stage for delaying a second input signal to generate a second output signal;

generating a first counter value by counting the first output signal;

generating a second counter value by counting the second output signal; and generating a comparing result signal by comparing the first counter value with the second counter value;

wherein the first delay stage has a larger delay amount than the second delay stage, the first counter starts counting earlier than the second counter, and the comparator outputs the comparing result signal when the second counter value falls within a predetermined range of values including the first counter value; wherein the step of utilizing at least a second delay stage for delaying a second input signal to therefore generate a second output signal comprises utilizing a plurality of second delay stages, where the second output signal corresponds to a portion of the second delay stages.

* * * * *